United States Patent [19]
Schweer et al.

[11] Patent Number: 5,619,142
[45] Date of Patent: Apr. 8, 1997

[54] TECHNIQUE FOR CALIBRATING A TRANSFORMER ELEMENT

[75] Inventors: G. Carl Schweer, Peterborough; Ross M. Pilkey, Omemee, both of Canada

[73] Assignee: Carma Industries, Peterborough, Canada

[21] Appl. No.: 503,402

[22] Filed: Jul. 17, 1995

Related U.S. Application Data

[63] Continuation of Ser. No. 118,880, Sep. 9, 1993, Pat. No. 5,453,697.

[51] Int. Cl.$^6$ .................................................. G01R 27/26
[52] U.S. Cl. ........................ 324/601; 324/74; 364/571.01
[58] Field of Search .............................. 324/74, 130, 601, 324/547, 546; 364/571.01; 29/593, 602.1

[56] References Cited

U.S. PATENT DOCUMENTS

| | | | |
|---|---|---|---|
| 3,142,798 | 7/1964 | Schwartz | 324/74 |
| 3,239,756 | 3/1966 | Price | 324/74 |
| 3,305,768 | 2/1967 | Koep | 324/74 |
| 3,532,964 | 10/1970 | Marks | 324/74 |
| 3,757,217 | 9/1973 | Pearson | 324/74 |
| 4,646,003 | 2/1987 | Philips | 364/571.01 |
| 4,843,306 | 6/1989 | Meuller | 324/74 |
| 5,061,890 | 10/1991 | Longini | 324/107 |
| 5,148,378 | 9/1992 | Shibayama et al. | 364/571.01 |
| 5,231,347 | 7/1993 | Voisine et al. | 324/74 |
| 5,325,048 | 6/1994 | Longini | 324/74 |
| 5,467,012 | 11/1995 | Nystrom | 324/74 |

*Primary Examiner*—Maura K. Regan
*Attorney, Agent, or Firm*—Thomas A. O'Rourke

[57] ABSTRACT

Disclosed herein is a transformer assembly, comprising a toroidal transformer element including a ring and a secondary winding wound around the ring; the ring being arranged to receive a main therethrough to form a primary winding; and a recording medium containing a set of successive incremental factors, each of the factors relating a measurement of a power component for one increment of power flowing through the secondary winding with an expected value of the power component for the increment of power flowing through the secondary winding, both the measurement and the expected value corresponding to a flow of power through the primary winding, wherein the transformer element, together with the set of factors, is capable of generating measurements of power with improved accuracy when corrected by the factors.

4 Claims, 7 Drawing Sheets

TECHNIQUE FOR CALIBRATING A TRANSFORMER ELEMENT

REFERENCE TO COPENDING APPLICATION

This is a continuation of U.S. patent application Ser. No. 08/118,880 filed Sep. 9, 1993, now U.S. Pat. No. 5,453,697.

BACKGROUND OF THE INVENTION

1. Field of the Invention

The present invention relates to transformer devices and more particularly to their calibration.

2. Description of the Related Art

In many larger apartment buildings, it is not possible to correctly apportion electrical power usage on an apartment by apartment basis since each apartment does not have a separate kilowatt hour meter. In such cases, the landlord cannot charge each unit a rental rate plus a power usage rate; the power usage must be part of the landlord's overhead. Of course, separate kilowatt hour meters could be installed for each apartment unit, but this could be quite expensive particularly where a large number of apartment units are involved.

Canadian Patent No. 1,254,266 describes a system for monitoring a number of meters by way of a sampling unit associated with a respective meter. The present invention provides a number of improvements over the system disclosed in the Canadian Patent.

An important component in electrical power monitoring systems is the use of a measuring device to measure electrical power consumption. Electrical power consumption is usually measured by way of a toroidal transformer device wherein the main through which power is to be measured is inserted through the centrally located hole in the transformer.

These toroidal transformers are relatively complex since they are expected to provide a substantially error free output and yet occupy a relatively small space. As a result such toroidal transformers can cost in excess of 100 dollars. Since electrical power monitoring systems can be expected to monitor up to 48 or more consumers, the cost to use these transformers can be significant.

It is an object of the present invention to provide a novel device for remotely monitoring an number of electrical utility meters.

It is a further object of the present invention to provide a novel transformer device.

SUMMARY OF THE INVENTION

Briefly stated, the invention involves a technique for calibrating a transformer element, comprising the steps of:

providing a transformer element with a primary winding and a secondary winding;

providing a memory to store a range of expected values of a power component, each value being representative of a flow of power expected through the secondary winding for a corresponding flow of power through the primary winding;

establishing a flow of power at a first level through the primary winding, thereby to establish a corresponding flow of power through the secondary winding;

measuring the power component for the flow of power through the secondary winding to obtain a first measurement thereof;

comparing the first measurement with a corresponding expected value and calculating a first factor according to the difference there between; and storing the first factor;

varying the flow of power in the primary winding to a second level;

measuring the power component for the flow of power through the secondary winding to obtain a second measurement thereof;

comparing the second measurement with a corresponding expected value and calculating a second factor according to the difference there between; and storing the second factor.

In one embodiment, the technique is carried out on a ring type transformer with a secondary winding wrapped around the ring and inserting a main through the ring to form the primary winding. A resistor element is placed across the secondary winding and the power component for the flow of power through the secondary winding is obtained by recording the voltage appearing across the resistor element. A first register provided to store the first and second measurements, while a second register to store the range of expected values. A comparator is also provided to compare the first and second measurements with corresponding expected values and to generate the factors.

In another aspect of the present invention, there is provided a device for calibrating a transformer element, comprising:

a transformer element having a primary winding and a secondary winding;

means for establishing a flow of power at a first level through the primary winding, thereby to establish a corresponding flow of power through the secondary winding;

means for varying the flow of power through a range thereof;

means for measuring a power component for the flow of power through the secondary winding to obtain a range of measurements thereof;

means for storing a range of expected values of a power component, each value being representative of a flow of power expected through the secondary winding for a corresponding flow of power through the primary winding;

a comparator for comparing each of the measurements in the range against a corresponding expected value;

means for calculating a range of factors according to the difference between a respective one of the range of measurements and a corresponding expected value;

means for storing the range of factors.

In still another aspect of the present invention, there is provided a transformer assembly, comprising:

a toroidal transformer element including a ring and a secondary winding wound around the ring; the ring being arranged to receive a main therethrough to form a primary winding; and a recording medium containing a set of successive incremental factors, each of the factors relating a measurement of a power component for one increment of power flowing through the secondary winding with an expected value of the power component for the increment of power flowing through the secondary winding, both the measurement and the expected value corresponding to a flow of power through the primary winding, wherein the transformer element, together with the set of factors, is capable of generating measurements of power with improved accuracy when corrected by the factors.

BRIEF DESCRIPTION OF THE DRAWINGS

Preferred embodiments of the present invention will now be described by way of example only as illustrated in the appended drawings, in which.

DESCRIPTION OF THE PREFERRED EMBODIMENTS

Referring to the figures, there is provided a transformer element, in the form of a current transducer 10 (the 'CT') to measure a power component, in this case current, through a main. The CT 10 has an integral burden resistor 10b across its secondary to generate a voltage corresponding to secondary current.

Figure 3:
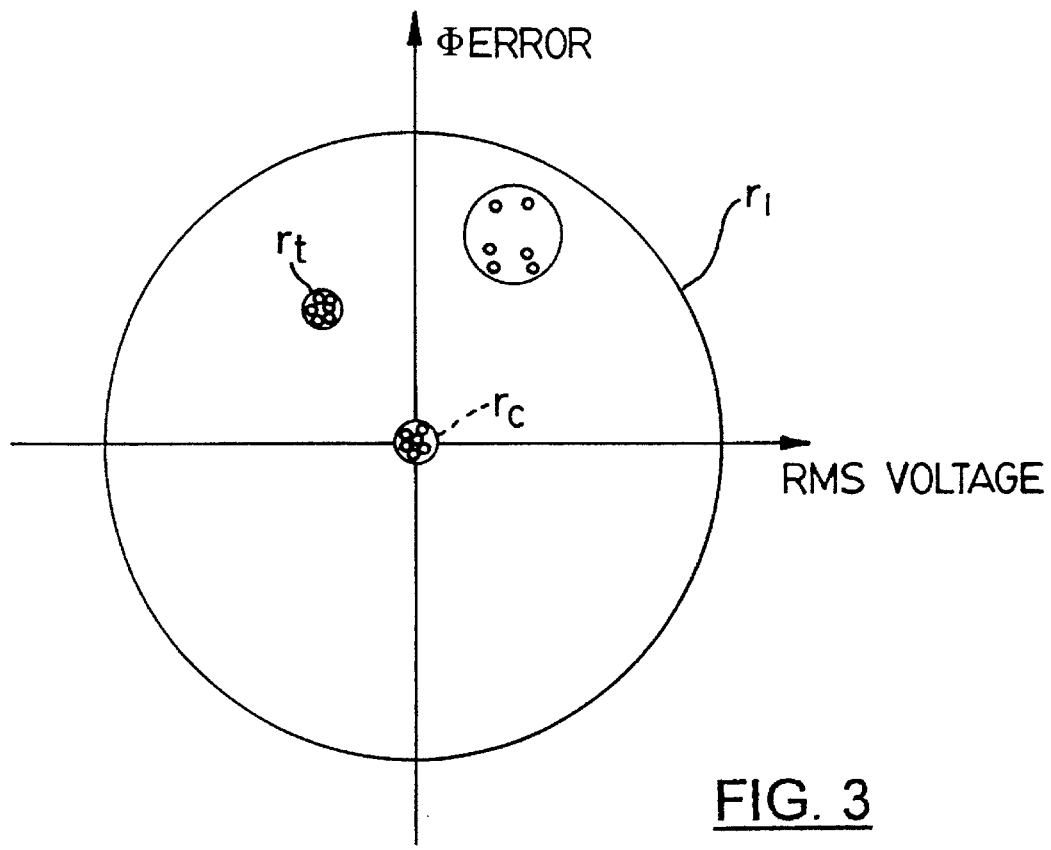
FIG. 3 is a graphic representation of transformer error.

The CT 10 is a 'crude' ring-type current transformer, whose specifications may be best illustrated by FIG. 3, illustrating the possible range of output signals represented by an x-y axis and several circles. The large circle represents the range of output signals. The smaller circles represents an array of outputs for a given transformer input, the smaller the circle the greater the 'repeatability' of the transformer. The closer the circles are to the center of the range, the higher their accuracy.

Each of the CT's 10 are distinct from conventional transformers in that they have a relatively high nonlinear phase error that can exceed as much as 3 degrees as opposed to the commercially acceptable limit of a few minutes of a single degree. The phase error is represented by the 'y' axis.

In addition the CT 10 has a non-linear RMS voltage curve over its range of primary currents which may have an error as high as ±2 percent. The non-linear RMS voltage curve error is represented by the 'x' axis.

Each CT 10 has a resistor 10b across its secondary to generate a voltage. In this manner, the EMP can monitor RMS voltage from the CT corresponding to the current flowing through its primary.

A particular feature of the present invention is a technique to calibrate the CT 10 so that it is capable of generating repeatable signals to within acceptable accuracy limits of conventional transformers, without the expenses associated with fabricating conventional transformers.

Figure 4:
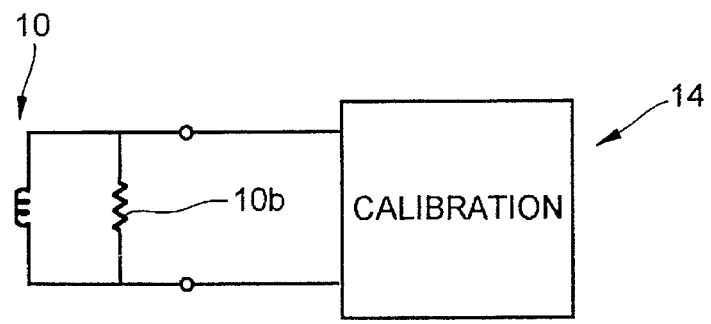
FIG. 4 is a schematic view of a calibration device.
Figure 5:
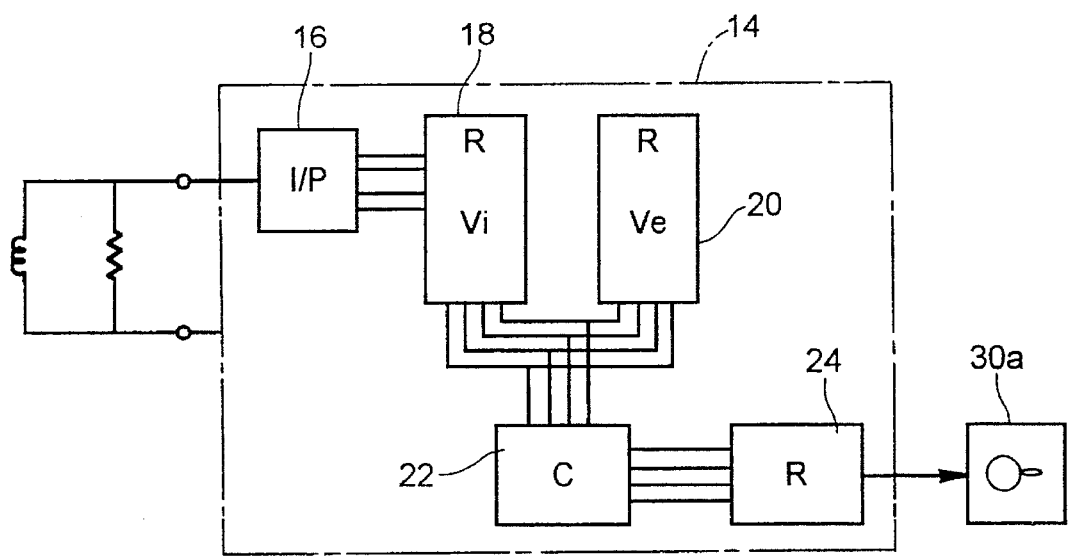
FIG. 5 is another schematic view of the device of FIG. 4.
Figure 6:
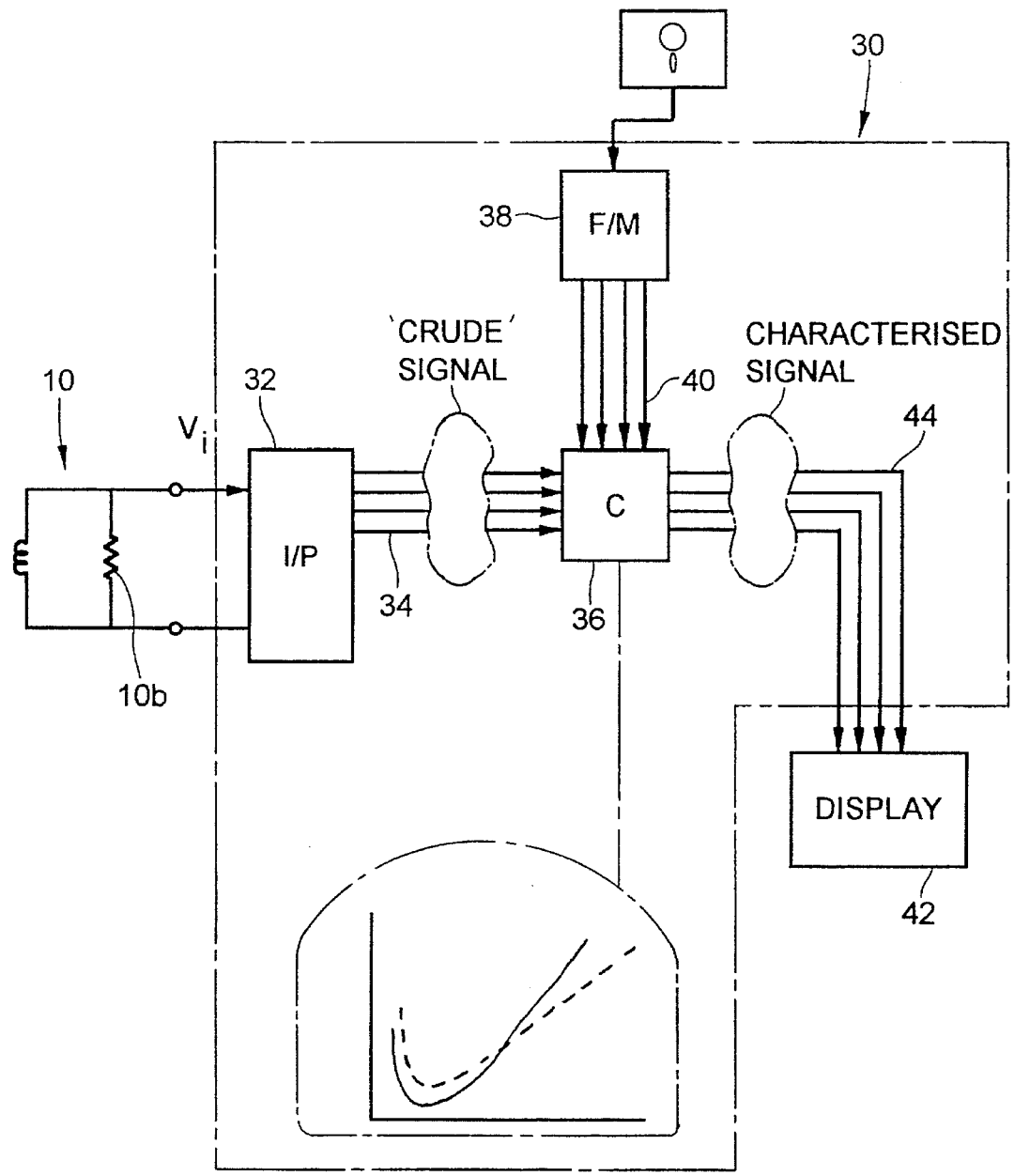
FIG. 6 is another schematic view of the device of FIG. 4.
Figure 7:
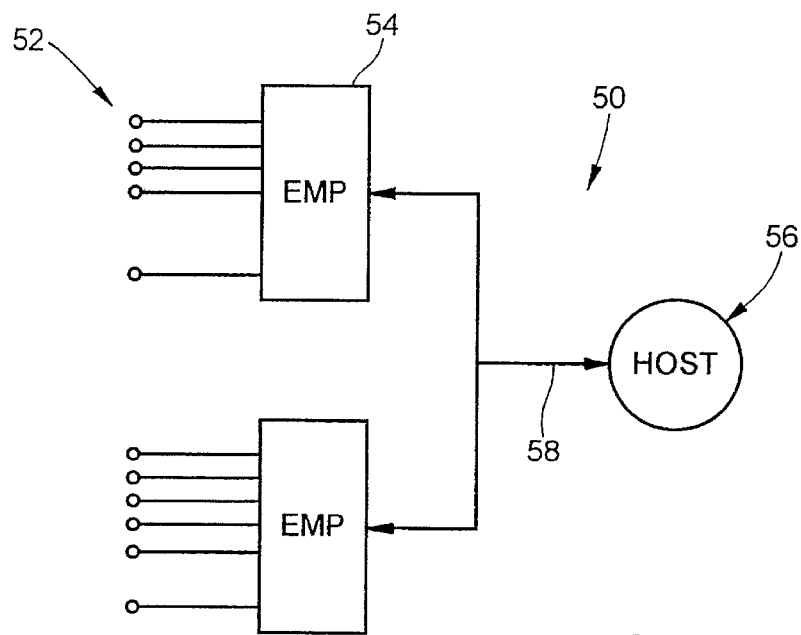
FIG. 7 is a schematic view of a device for monitoring a number of electrical utility meters.

Referring to FIGS. 4 to 6, the CT 10 along with its integral burden resistor 10b are coupled to a calibration device 14 which includes an input unit 16 which generates a digital output for each incremental increase in current flowing through the primary, in this case the main. The input unit 16 may include zero crossing detection circuitry, for example, to accommodate the sinusoidal waveform generated by the CT 10.

The input unit 16 has a digital output which is joined to a register 18 to store the range of digital outputs from the input unit 16. Another register 20 is provided to store a parallel range of 'expected' digital voltage values, corresponding to the outputs that would be generated by a transducer employing a standard transducer.

A comparator 22 communicates with both registers 18 and 20 and outputs digital signals to an output register 24. The output register 24 in turn communicates with a drive unit to output a file containing the digital values stored in the output register 24.

To prepare the calibration device 14, a range of 'expected' voltage outputs $V_e$ are stored in register 20 which correspond to the values expected from a commercial standard transformer of the same transfer ratio as that used in the CT 10, but with a repeatability and accuracy of the circle $r_c$ in FIG. 3. Those values that will be compared with the actual values from the CT 10 under test which may for example have repeatability and accuracy of circle $r_t$.

The present technique involves establishing a flow of power at a first level through the primary winding, thereby to establish a corresponding flow of power through the secondary winding. The power component, in this case the current, is then measured for the flow of power through the secondary winding to obtain a first measurement thereof. The first measurement is compared with a corresponding expected value and a first factor is determined according to the difference there between. This first factor is then stored.

The technique is continued by varying the flow of power in the primary winding to a second level. The current is measured again to obtain a second measurement thereof. The second measurement is compared with a corresponding expected value and a second factor is determined according to the difference there between. The second factor is then stored. These steps are repeated as necessary to obtain a suitable number of increments through the desired range, for example up to about 200 increments in the range as will be described.

In the case of the CT 10, a range of currents are successively passed through the primary of the CT 10 so that the corresponding voltage of the secondary, $V_i$, is generated across the resistor 10b and which is received by the input device 16. The input device 16 generates a digital representation for each voltage $V_i$ which is stored in an appropriate location in register 18. After a range of Voltages $V_i$ have been accumulated in the register 18, the comparator 22 compares each voltage $V_i$ with a corresponding voltage $V_e$ stored in the register 20.

After comparing the values $V_i$ and $V_e$, the comparator 22 generates a number of factors sufficient to convert each value $V_i$ to a corresponding value $V_e$. The factor data is then stored in output register 24 for later down loading to a recording medium if desired, such as a computer disk 30a.

The calibration device 14 may also be used to determine the phase error of the CT 10, that is the incremental lag or lead of the voltage waveform caused by the CT 10. In this case, the input device 16 may be arranged to generate output values of phase error for each incremental increase in current through the main, thereby causing phase error values to be stored in register 18 to be compared with 'expected' phase error values stored in register 20.

In effect, calibration device 14 records the RMS voltage and phase error characteristics over the operating range of current through the main. The characteristics are then mathematically adjusted to approximate the curves of conventional transformers. This may be conveniently done by way of the 'least squares' method, in which case a least squares fit is made to replace the resulting voltage and phase error curves with a series of sloped straight line curves, each corresponding to a given range of input currents. In this way, the least squares calculation will generate a slope and offset factor to shift the actual RMS voltage and phase error curves to within the range expected from a conventional transformer.

Stored on an appropriate medium such as a computer disk, the factor data can be assembled with the CT and conveniently incorporated into any system in need of a CT. For illustration, a monitoring device is shown at 30 in FIG. 6. The monitoring device 30 has an input device 32 which is coupled to a CT 10 with its integral burden resistor 10b. The CT may for example, be monitoring the current flowing through a power line, in which case the output voltage $V_i$ is representative of the level of current in the line. Joined to the input device 32 via a bus 34 is a characterization unit 36. The characterisation unit 36 also communicates with a factor memory unit (the F/M unit) 38 via bus 40. The output of the characterisation unit 36 is joined to an appropriate display 42 by way of a bus 44.

In use, the characterisation unit receives 'crude' signals of $V_i$ from the input unit 32 and receives factor data, such as the slope and offset values from a prior least squares calculation, from the F/M unit 38. The characterisation then performs calculations to convert the 'crude' $V_i$ signals to characterized $V_e$ signals which are then conveyed to the display 42.

This technique enables a normally unfit crude CT to be used to generate $V_e$ signals closely approximating the accuracy of signals emerging from a highly refined and thus expensive conventional transformer. While the CT 10 is a ring type transformer, other types of transformers may be suited to this calibration technique such as induction coils and the like.

Another example of the use of this technique is illustrated in FIGS. 7 to 12, which illustrate a device 50 for monitoring a number of electrical utility meters. The device 50 includes a number of sampling units 52, in this case, two groups of 16 sampling units 52 for 48 electrical utility meters. Each group of 16 sampling units 52 communicates with an Electrical Monitoring Pod 54 (the 'EMP'). Each EMP 54 communicates with a host 56 along a bus 58.

Figure 8:
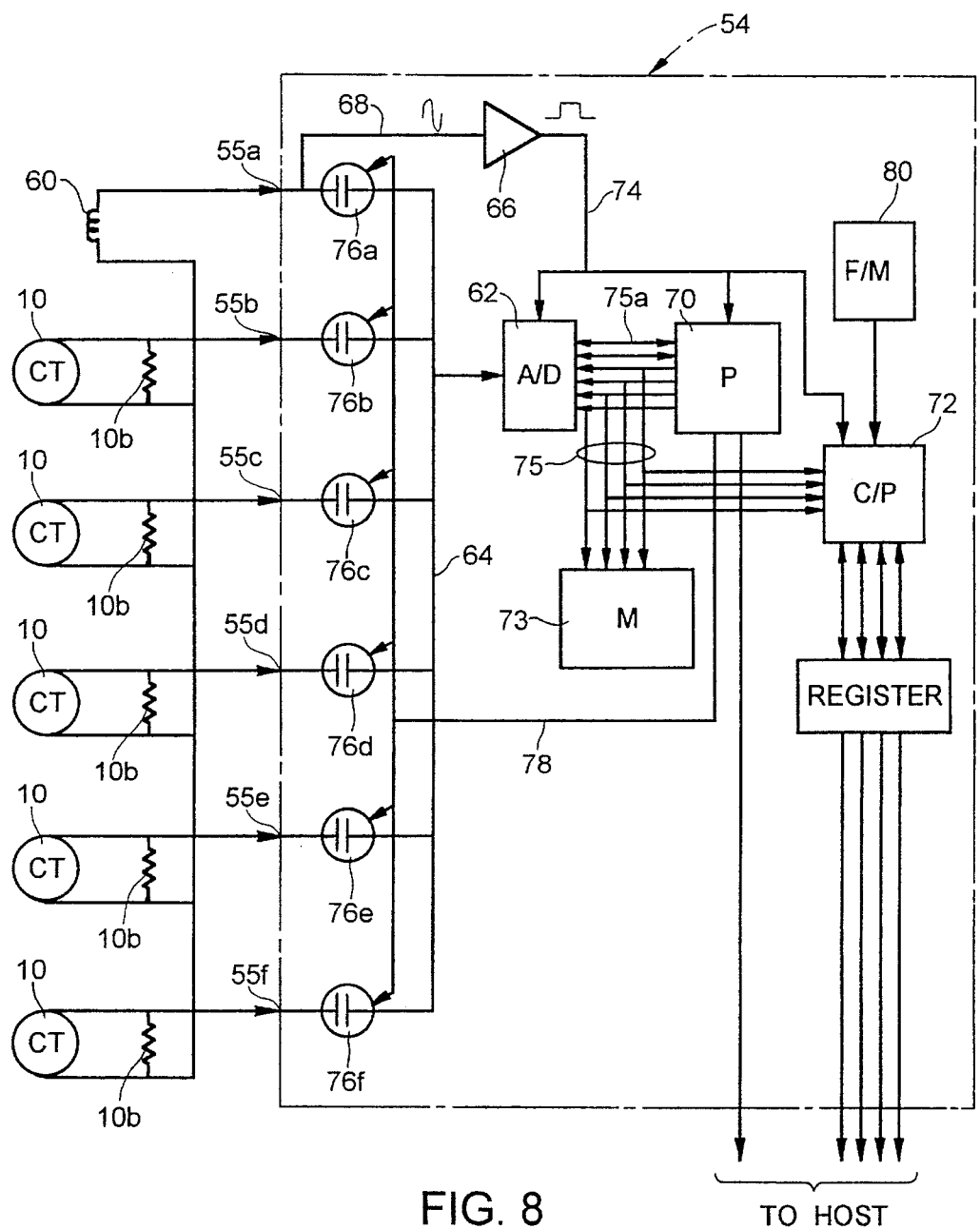
FIG. 8 is s schematic view of a portion of the device illustrated in FIG. 7.

Referring to FIG. 8, each sampling unit 52 employs a CT 10 to measure current through each main. As above, the CT 10 has an integral burden resistor 10b across its output leads to generate a voltage corresponding to the secondary current. Each group of sampling units 52 share a potential transformer (the 'PT') 60 to measure the voltage across the main.

The EMP 54 has a number of inputs 55a to 55f to receive signals from each sampling unit and has an analog to digital (A/D) converter 62 that receives signals from the sampling units 52 via a bus 64. A number of switches 76a to 76f govern the flow of data from the sampling units to the bus 64.

The EMP 54 has a zero crossing detector 66 which receives a voltage signal from the PT 60 along path 68. The EMP 54 has a processor 70 to handle the data traffic through the EMP 54 and a co-processor 72 to make power and phase shift calculations. The processor 70, the A/D converter 62 and the co-processor 72 communicate with a memory unit 73 along bus 75.

The A/D converter 62 generates a 12 bit number representative of the sampled input waveform. The sampling rate is controlled by the processor 70 which conveys a start bit to the A/D converter on path 75a. The processor 70 also controls the CT that is being sampled by conveying a data bit along the path 78. The path 68 bypasses the switch 76 controlling the PT 60 so that the zero crossing detector will always receive the PT voltage waveform.

The zero crossing detector 66 communicates with the A/D converter 62 and the processor 70 along path 74 to initiate signal conversion on the bus 64 when a zero crossing is detected in the voltage waveform.

The digital outputs of the A/D converter 62 communicate with the processor 70 by way of bus 75 to store the sampled digital outputs in the memory unit. The EMP 54 also has a factor memory unit 80 (the 'F/M' unit) that stores slope, offset and scaling factors.

Figure 9:
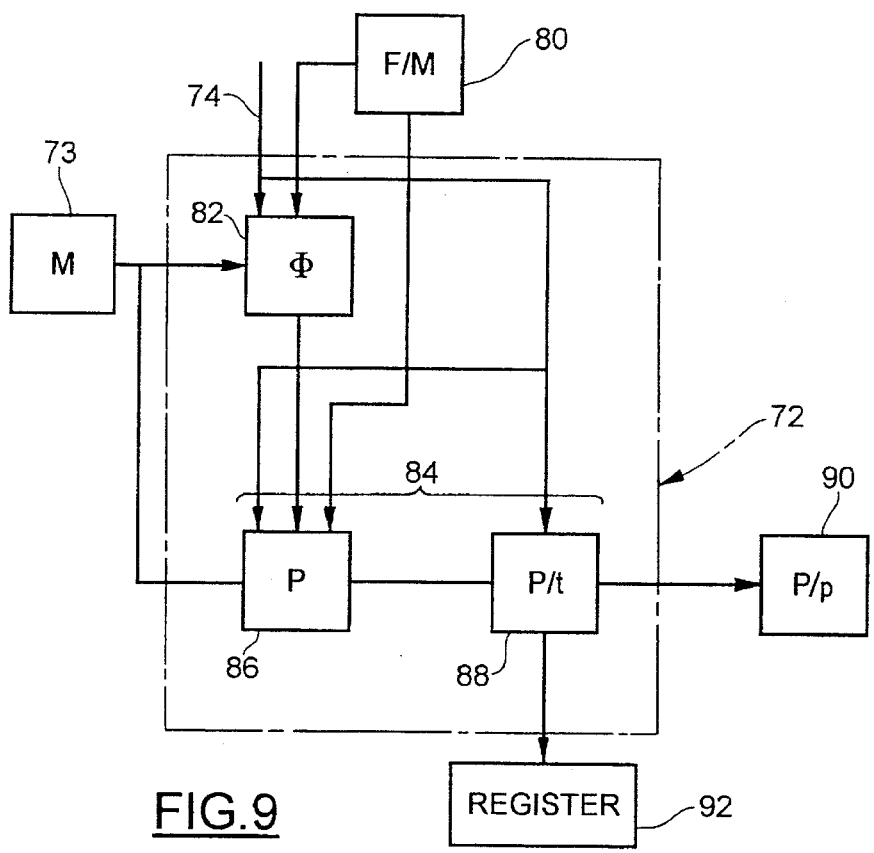
FIG. 9 is a graphic representation of data stored by the device of FIG. 7.

Referring to FIG. 9, the co-processor 72 includes a phase angle unit 82 and a power unit 84, both of which communicate with the memory unit 73 and the F/M unit 80 and receive a signal from the zero crossing detector on path 74. The phase angle unit 82 determines the phase angle between the voltage and current waveforms. The power unit 84 includes a calculating portion 86 that calculates power consumed for each sampled waveform by the formula:

$$P = \int V_i I_i, \text{ where } i = \text{sample}$$

The power unit 84 also includes a summing portion 88 measures power consumed by summing the individual sample power calculations over one wavelength. Communicating with the power unit 84 is a peak power register 90 to store the value of $P_t$ as peak power and will substitute the value stored only if exceeded by a subsequent $P_t$ value.

The power unit 84 communicates with a Time-of-Use Register 92 to store the value $P_t$ according to the time at which the calculation was made.

Figure 10:
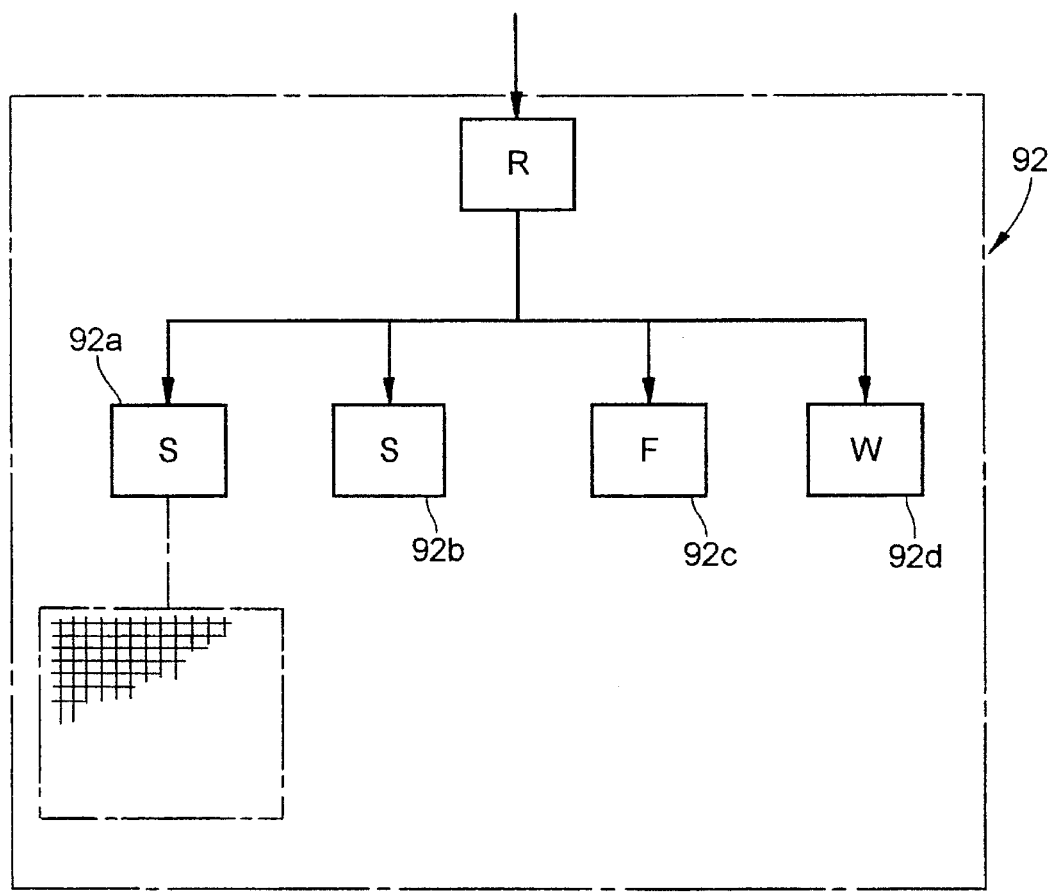
FIG. 10 is a schematic view of another portion of the device illustrated in FIG. 7.
Figure 11:
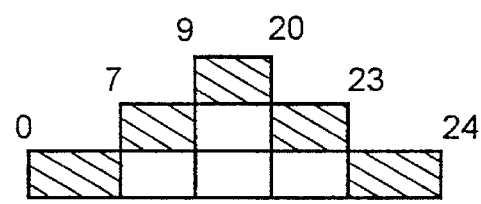
FIG. 11 is a graphic representation of the storage of data by the device in FIG. 7.

Referring to FIG. 10, the Time-of-Use Register 92 includes four seasonal registers 92a to 92d, each corresponding to a particular season. Each seasonal register in turn has a number of daily registers which correspond to the number of days in each season. Each daily register has five hourly registers, the distribution of which is shown in FIG. 11. The peak period is preferably set for between 0900 hours and 2000 hours. The 'off peak' period is separated into four times, that is 0000 hours to 0700 hours, 0700 hours to 0900 hours, 2000 hours to 2300 hours and 2300 hours to 2400 hours.

Figure 1:
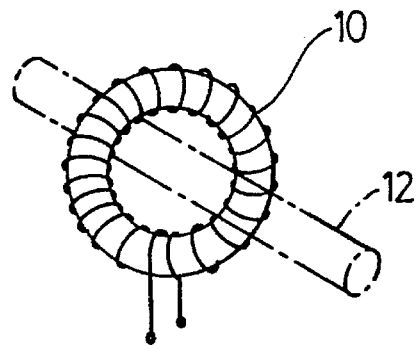
FIG. 1 is a schematic view of a transformer device.
Figure 2:
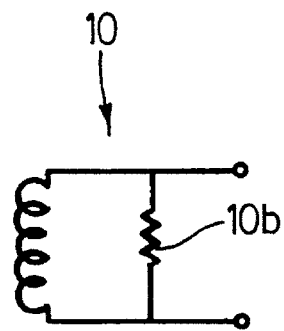
FIG. 2 is a schematic view of the device of FIG. 1.

For example, assume that primary current in each CT 10 shown in FIG. 2 has a current flowing through the secondary of up to 100 mA RMS. This secondary current is converted to a voltage by the integral burden resistor across the secondary monitored by the EMP 54. In this case, the CT 10 has a 100 A rating, the Current Transfer Ratio for Primary to Secondary of 1000/1, a primary current of 2 to 100 amps and a secondary voltage of 0.124 to 6.2 VRMS.

Figure 12:
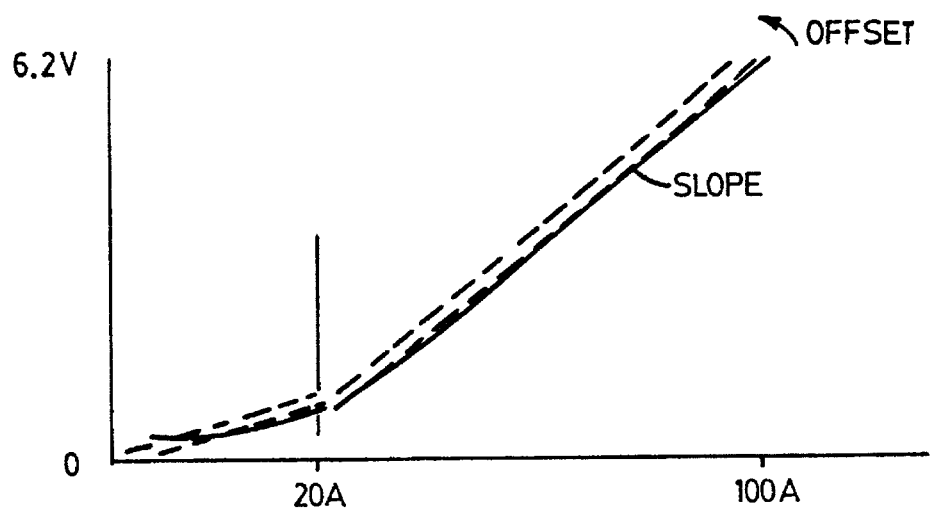
FIG. 12 is a graph of secondary voltage versus primary current flow.

As shown in FIG. 12, amplitude characterization involves using the EMP 54 to measure the RMS amplitude of the secondary voltage over the primary current operating range, and calculating a slope and offset factor for a least squares fit of the measured secondary RMS voltage to the applied primary current. Due to the wide primary current range, slopes and offset factors are calculated for two ranges, less than 20 A and 20 A or greater.

Figure 13:
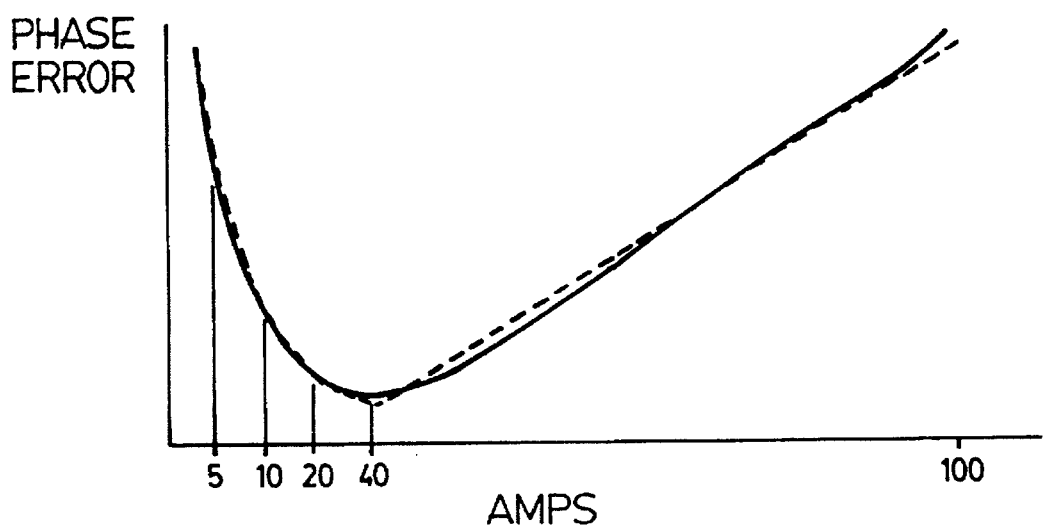
FIG. 13 is a graph of phase error versus primary current flow.

As shown in FIG. 13, phase error characterization involves using the Zero crossing detector 66 to measure the phase error of the secondary voltage over the primary current range and calculating a slope and offset factor for a least squares fit of the measured angle to the applied primary current. Due to the nature of the error, slopes and offset factors are calculated for four primary current ranges, up to 5 A, 5–10 A, 10–20 A and over 20 A.

During operation, each CT 10 generates voltages across the resistor on the secondary and these voltage values appear on the CT outputs. Meanwhile, the PT 60 generates a voltage waveform on the input of the zero crossing detector 66. When the zero crossing detector 66 detects a high-to-low transition, a pulse is generated on the zero crossing detector 66 output which is conveyed to the processor 70 and the A/D converter 62. The processor 70 then conveys a start bit to the switch 76a to transmit the $V_i$ analog data to the A/D converter 62 from the PT 60. Through a communication protocol between the processor, the A/D converter and the memory, a number of 12 bit digital output values will be stored in the memory corresponding to samples of the voltage waveform appearing at the A/D converter. When the sampling of the waveform is complete, the processor 70 conveys a signal to close switch 76a to terminate the sampling of the PT's waveform. However, the path 68 bypasses the switch 76a to allow the zero crossing detector 66 to continue its function.

The zero crossing detector 66 continues to senses a subsequent high-to-low transition and generates a pulse on path 74 and the processor 70. At the appropriate time, the processor 70 will initiate the sampling of one of the CT's by closing switch 76b, at which point a number of 12 bit digital output values will be stored in the memory corresponding to samples of the voltage waveform again appearing at the A/D converter.

Figure 8A:
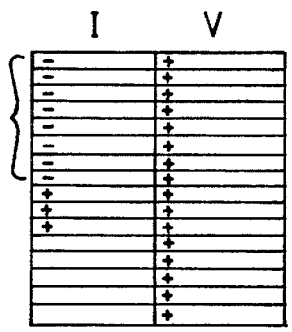
FIGS. 8a and 8b are representations of data collected by the device illustrated in FIG. 7.
Figure 8B:
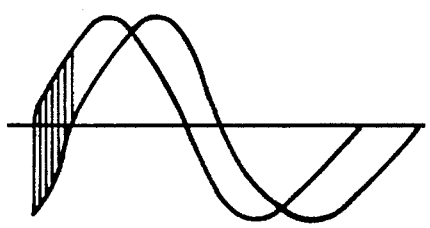

Referring to FIGS. 8a and 8b, the voltage will typically lead the current waveform. At the instant the zero crossing detector 66 detects a high-to-low transition, the A/D begins generating digital values of the current waveform. In the case where the voltage is leading the current, the first few current waveform samples will be negative and thereafter the current waveform will itself have a low-to-high transition seen by the sudden appearance of numbers above the zero level. Preferably, the A/D converter 62 generates 12 bit numbers between 0 and 4096 with the 2048 value corresponding to the 'zero' voltage level. Thus the first occurrence of a value below 2048, namely at $t=I_{zc}$ represents the instant of a zero crossing by the current. The number of values that appeared from $t=0$ to $t=I_{zc}$ represents the duration of the phase lag which can then be converted into a phase angle, by calculating the number of degrees or scaled fractions thereof per unit time.

The first CT is sampled during the period of one waveform. The period of the 60 hertz waveform is 16.67 milliseconds. During one wavelength, as many as 980 samples may be taken. In order to get a full waveform sample, the sampling time may in fact exceed the time of one wavelength. In this case, the EMP 54 will not initiate the sampling of a second CT until the detection of another zero crossing by the Zero crossing detector. This means that a portion of one wavelength remains for housekeeping functions by the EMP 54, including communicating with the host and performing various power calculations.

FACTOR CALCULATION

The slope and offset factors for the linear curve fits are calculated as follows:

$$\text{slope} = \frac{n\,\text{sum}(xy) - \text{sum}(x)\text{sum}(y)}{n\,\text{sum}(x*x) - (\text{sum}(x))*(\text{sum}(x))}$$

$$\text{offset} = \frac{\text{sum}(x*x)\text{sum}(y) - \text{sum}(x)\text{sum}(xy)}{n\,\text{sum}(x*x) - (\text{sum}(x))*(\text{sum}(x))}$$

where:

n=number of samples (1+last−first)

x=independent variable: sensor data for rms, measured data for phase y=dependent variable: measured data for rms, sensor data for phase These formulae are based on the following EMP 54 scaling and correction factor calculations:

Measured current=(slope)*(RMS number)+(offset)

where x=RMS number y=Measured voltage or current

Phase error=slope, Measured current+offset where:

x=Measured Current y=Phase error

The phase angle is measured by driving the voltage input of the EMP 54 with the test load voltage and the current input of the CT under test with the output of the same CT. The times at which the high-to-low zero crossings occur are read from the Zero crossing detector 66 counters to a resolution of 2 μs.

From these counts, the phase angle between the signals is determined in the EMP 54 by the following calculation:

$$\text{phase angle (deg)} = \frac{[z_1 - z_c] \times 360 \times 10^2}{z_1 - z_3}$$

where:

$z_1-z_c$ is the difference between the CT and test voltage zero crossing counts;

$z_1-z_3$ is the number of counts for one period of the test voltage signal;

$10^2$ is the scaling factor of 100 to maintain two places of decimal in the integer result The calculated phase angle is then normalized to a value between 09 and 90 degrees.

EMP INPUT SCALING AND CORRECTION

During operation of the EMP 54, the measured RMS signal amplitudes are scaled to respective RMS values of voltage and current, and the phase error of each CT is determined and used to correct the measured phase difference between a PT 60 and associated CT signal.

Integer arithmetic is used in the EMP 54 for all calculations and any fractional results are lost, so significant decimal places are carried by appropriate scaling. For example, a result calculated to two decimal places incorporates an inherent scaling factor of 100. Further, scaling of 16-bit slopes and offset factors and intermediate results is used to maintain sufficient accuracy for the calculations.

RMS AMPLITUDE SCALING

The RMS amplitude value of each signal is determined by the EMP 54. This result is then scaled to arrive at the actual voltage or current. Scaling is performed using the slopes and offset factors determined during transducer characterization. These calibration factors, scaled appropriately, are stored in the EMP 54 as part of the meter configuration data.

The RMS amplitude for a signal is calculated to four decimal places, and so incorporates an inherent scaling factor of $10^4$. However, the slopes and offset factors are based on these scaled values and so this scaling must be taken into account. The RMS current and voltage results are calculated to two decimal places and thereby require a result scaling factor of 100.

VOLTAGE SCALING

The calculation performed in the EMP 54 to scale an RMS signal amplitude to voltage is as follows:

$$\text{VRMS}(0.01 \text{ volt}) = \frac{(\text{RMS amplitude} \times \text{slope}) + \text{offset}}{2048 \times 10^4}$$

To provide compatible orders of magnitude for the addition and arrive an overall scaling factor of $10^2$ for a result in 0.01 volts, requires the stored slopes and offset factors to incorporate the following prescaling:

(a) voltage slope factor prescaling: $2048 \times 10^6$;
(b) voltage offset factor prescaling: $10^2$.

The stored offset factor is added as a 12 bit word to the 12 bit result of the scaled slope calculation, allowing proper results for either positive offsets or negative offsets in two's complement form. However, only positive slopes are allowed.

CURRENT SCALING

The calculation performed in the EMP 54 to scale an RMS signal amplitude to current is as follows:

$$I\text{RMS}(0.01 \text{ amp}) = \frac{\text{RMS amplitude} \times \text{slope} + (\text{offset} \times 10^4)}{10^7}$$

To provide compatible orders of magnitude for the addition and arrive at an overall scaling factor of $10^2$ for a result in 0.01 amps, requires the stored slopes and offset factors to incorporate the following prescaling:

(a) Current slope factor prescaling: $10^9$;
(b) Current offset factor prescaling: $10^5$.

Only positive slopes and offset factors are allowed for the calculation.

Due to the wide operating range of the CT's, two sets of factors are used, one for currents of up to 20 A an the other for currents of 20 A or greater. Since the current is not known until the scaling factor is applied, an Empirical RMS amplitude value of 2540000 is used to represent the 20 A breakpoint.

CT PHASE ERROR CALCULATION

Correction of the CT phase error is performed by subtracting the error from the measurement. Instead of determining the actual phase error, the EMP 54 calculates the negative of the error, a factor which can be added to the measured phase error to correct it. The sign of the calculation is negated by using a positive value of the slope and offset and changing the sign of the offset operation during the calculation. Thus, the calculation performed in the EMP 54 to determine the CT phase error from its calculated primary current is as follows:

$$\text{Phase error}(0.01 \text{ deg}) = \frac{(I\text{RMS} \times \text{slope}) - (\text{offset} \times 10^2)}{10^4}$$

The current value is in 0.01 amp, incorporating a scaling factor of $10^2$, so the offset is multiplied by the same factor to provide compatible orders of magnitude for the addition. To arrive at an overall scaling factor of $10^2$ for a result in 0.01 degrees requires prescaling of each of the factors by $10^4$. Only positive slopes and offset factors are allowed.

Four sets of factors are stored and the appropriate ones selected based on the primary current. The four current ranges are up to 5 A, 5 to 10 A, 10 to 20 A, and above 20 A.

PT CALIBRATION

SET UP

The calibration set up for the PT's is shown in FIG. 8. The test voltage is isolated from the 120 VAC line and regulated via a constant voltage transformer. It is adjusted to the required level via a variac. The primaries of up to 32 PT's are connected in parallel to the variac output, with their secondaries connected to the EMP 54 signal inputs starting at terminal pair 16/17 (normally the CT0 position). The variac output voltage is resistively divided and applied to EMP 54 terminals 1/2, normally the PT0 input.

PROCEDURE

For each test voltage, the host 56 sets the multimeter to the max/min voltage mode and then starts the scan sequence of the EMP 54. When the scan is completed, the host 56 reads the max and min values from the meter, followed by the RMS number an unfixed phase results for all 32 CT inputs from the EMP 54.

The RMS number is the result of the RMS calculation of the signal amplitude read by the EMP 54 over one cycle of the reference signal applied to the PT0 input. The unfixed phase angle represents the angle normalized to a range from 0–90 degrees between the respective PT 60 secondary signal and the reference applied to the PT0. The value is calculated to 0.01 degrees and multiplied by 100 for representation in integer form.

The voltage stored for the test step is the average of the max and min value. The values received from the EMP 54 are displayed along with the average test voltage and percent deviation from the max and min values.

At the end of the sequence a group data file is written to disk. This file contains each average test voltage alone with the RMS amplitude and phase any results for the number of transducers being tested. Also individual files are written containing the average test voltages and all results for a sensor. The group file name indicates the first serial number of the group. Individual file names contain the transducer serial number.

CT CALIBRATION

SET UP

The calibration set up for the CT's is shown in FIG. 9. The 120 volt line input is stepped down to about 6 VRMS by a series/parallel connected group of transformers to provide a test current capacity of about 100 A. The load consists of high wattage resistors which are switched across the test voltage via relays controlled by signals from a PC parallel port of the host 56. The resistor combinations used provide current steps of about 0.5 A, that is, about 200 increments across the current range.

The conductor carrying the load current is routed through up to 32 CT's to provide their primary current source. The CT secondaries are connected to the EMP 54 signal inputs starting at terminal pair 16/17 (normally the CT0 position. The test voltage is connected directly to EMP 54 terminals 1/2, normally the PT0 input, to provide a phase reference signal.

The load current also flows through a meter shunt resistor. The voltage drop across this resistor is amplified and then measured by a Fluke remotely controllable multimeter. This measurement can be read by the host 56 and scaled to determine the test current.

Procedure

The load current is selected between 2 and 100 A by the host 56. Fixed resistive combinations are used and at loads the actual load current generated varies with the resistance of the primary conductor. Calibration data from 1 to up to 32 CT's can be acquired at one time, as selected by the operator, but data for 32 sensors is always returned by the EMP 54.

For each test current, the host 56 sets the multimeter to the max/min voltage mode then starts the scan sequence of the EMP 54. When the scan is completed, the host 56 reads the max and min values from the meter followed by the RMS number and unfixed phase results for all 32 CT inputs from the EMP 54.

The RMS number is the result of an RMS calculation of the signal amplitude read by the EMP 54 over one cycle of the test signal applied to the PT0 input. The unfixed phase angle represents the angle normalized to a range from 0–90 degrees between the respective CT secondary signal and the test reference applied to the PT0. The value is calculated to 0.01 degrees and multiplied by 1200 for representation in integer form.

The current stored for the test is derived from the average of the max and min voltage values. The values received from the EMP 54 are displayed along with the average test current and percent deviation from the max and min values.

At the end of the sequence, a group data file is written to disk. This file contains each average test current along with the RMS amplitude and phase angle results for the number of transducers being tested. Also, individual files are written containing the average test currents and all results for a sensor. The group file name indicates the first serial number of the group. Individual file names contain the transducer serial number.

We claim:

1. A calibrated transformer unit for use in a metering device, comprising:

a crude toroidal transformer element including a ring and a secondary winding wound around said ring; said ring being arranged to receive a main therethrough to form a primary winding; and a recording medium containing a set of successive incremental factors, said set of factors being dedicated to said crude toroidal transformer element and each of said factors relating a measurement of a power component for one increment of power flowing through said secondary winding with an expected value of said power component for said increment of power flowing through said secondary winding, both said measurement and said expected value corresponding to a flow of power through said primary winding, wherein said crude transformer element, together with said set of factors, is capable of generating measurements of power with improved accuracy when corrected by said factors.

2. A calibrated transformer unit as defined in claim 1 wherein said power component is phase angle.

3. A calibrated transformer unit as defined in claim 2, further comprising a resistor element across said secondary winding, wherein said power component is the RMS voltage appearing across said resistor element.

4. A calibrated transformer as defined in claim 1 wherein said recording medium contains a first set of successive factors, each relating to a measurement of phase angle and a second set of successive factors each relating to a measurement of RMS voltage, each of said first set having a corresponding one of said second set for a given flow of power through said secondary winding.

\* \* \* \* \*